United States Patent
Nagao et al.

(10) Patent No.: US 9,949,333 B2
(45) Date of Patent: Apr. 17, 2018

(54) SEMICONDUCTOR DEVICE

(71) Applicant: Rohm Co., Ltd., Kyoto (JP)

(72) Inventors: Kei Nagao, Kyoto (JP); Toru Takahashi, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 0 days.

(21) Appl. No.: 15/660,512

(22) Filed: Jul. 26, 2017

(65) Prior Publication Data
US 2018/0035512 A1 Feb. 1, 2018

(30) Foreign Application Priority Data

Jul. 27, 2016 (JP) .................................. 2016-147395

(51) Int. Cl.
*H05B 33/00* (2006.01)
*H05B 33/08* (2006.01)
*B60K 37/02* (2006.01)
*G01R 31/44* (2006.01)

(52) U.S. Cl.
CPC ......... *H05B 33/0887* (2013.01); *B60K 37/02* (2013.01); *G01R 31/44* (2013.01); *H05B 33/0815* (2013.01)

(58) Field of Classification Search
CPC .................. H05B 33/0815; H05B 33/0887
See application file for complete search history.

(56) References Cited

U.S. PATENT DOCUMENTS 7,598,686 B2 * 10/2009 Lys .................... H05B 33/0815
315/292
2014/0300377 A1 10/2014 Onodera

FOREIGN PATENT DOCUMENTS

JP 2014-211436 11/2014

* cited by examiner

*Primary Examiner* — Monica C King
(74) *Attorney, Agent, or Firm* — Fish & Richardson P.C.

(57) ABSTRACT

A semiconductor device includes: a diagnosis portion which diagnoses, when the device is started up, whether an abnormality occurs in a component for setting that is externally connected; and a control portion which stops the startup of the device when the diagnosis portion diagnoses that an abnormality occurs, the diagnosis portion diagnoses whether an abnormality occurs in which the connection of the component for setting that is a resistor is disconnected, the semiconductor device further includes an external terminal which is connected to one end of the resistor and the diagnosis portion includes a constant current circuit which passes a constant current through the resistor via the external terminal, a comparator to which a voltage produced at the external terminal is input and a transistor which switches between the connection and interruption of a path along which the constant current is passed.

19 Claims, 9 Drawing Sheets

SEMICONDUCTOR DEVICE

BACKGROUND OF THE INVENTION

This application is based on Japanese Patent Application No. 2016-147395 filed on Jul. 27, 2016, the contents of which are hereby incorporated by reference.

FIELD OF THE INVENTION

The present invention relates to semiconductor devices.

DESCRIPTION OF THE RELATED ART

Conventionally, various power supply drivers and the like which include an LED driver that drives an LED (light-emitting diode) are generally formed as one chip semiconductor device. To such a semiconductor device, a large number of resisters for setting and capacitors for setting are often externally connected.

For example, when the semiconductor device is a power supply driver, a voltage dividing resistor which divides an output voltage in order to perform feedback control for feeding back the output voltage or a voltage dividing resistor which divides the output voltage in order to detect an overvoltage may be provided so as to be externally connected. The voltage dividing resistor described above functions as a resister for setting which is intended to set the target value of the output voltage or an overvoltage setting value.

Moreover, when the semiconductor device is a power supply driver, an external capacitor for setting may be provided in order to set a soft start function, a frequency spread (spectrum spread) function or the like.

However, since the resister for setting or the capacitor for setting as described above is externally connected, the connection may be disconnected or a resistance value or a capacitance value may be erroneously set. For example, when an abnormality occurs in the state of the resister for setting described above, it is likely that the target value of the output voltage becomes abnormal or the overvoltage setting value becomes abnormal such that, for example, the output voltage exceeds an external component withstand voltage or a semiconductor device withstand voltage or heat generation becomes abnormal. This may lead to the destruction of the device.

For example, when an abnormality occurs in the state of the capacitor for setting described above, it is likely that the abnormality adversely affects the operation and properties of the semiconductor device.

Here, conventionally, for example, when the semiconductor device is an LED driver, there is a self-diagnosis function which checks whether or not an LED is connected at the time of startup of the semiconductor device. However, even with such a function, an abnormality in an external component for setting cannot be detected at the time of the startup, and thus it is impossible to prevent an erroneous operation.

Although Japanese Unexamined Patent Application Publication No. 2014-211436 discloses an input circuit which performs self-diagnosis on whether or not an abnormality occurs in an external capacitor, the capacitor described above is not a component for setting but a filter capacitor.

SUMMARY OF THE INVENTION

In view of the foregoing conditions, an object of the present invention is to provide a semiconductor device which can previously reduce an erroneous operation based on an abnormality in an external component for setting.

A semiconductor device according to one aspect of the present invention includes: a diagnosis portion which diagnoses, when the device is started up, whether an abnormality occurs in a component for setting that is externally connected; and a control portion which stops the startup of the device when the diagnosis portion diagnoses that an abnormality occurs, where the diagnosis portion diagnoses whether an abnormality occurs in which connection of the component for setting that is a resistor is disconnected, the semiconductor device further includes an external terminal which is connected to one end of the resistor and the diagnosis portion includes a constant current circuit which passes a constant current through the resistor via the external terminal, a comparator to which a voltage produced at the external terminal is input and a transistor which switches between the connection and interruption of a path along which the constant current is passed.

A semiconductor device according to one aspect of the present invention includes: a diagnosis portion which diagnoses, when the device is started up, whether an abnormality occurs in a component for setting that is externally connected; and a control portion which stops the startup of the device when the diagnosis portion diagnoses that an abnormality occurs, where the diagnosis portion diagnoses whether an abnormality occurs in which the resistance value of the component for setting that is a resistor falls outside a specified range, the semiconductor device further includes an external terminal which is connected to one end of the resistor and the diagnosis portion includes a voltage dividing resistor, one or two comparators to which a voltage produced at the external terminal by performing voltage division with the voltage dividing resistor and the resistor is input and a transistor which switches between the connection and interruption of a path along which a power supply voltage is applied to the voltage dividing resistor.

A semiconductor device according to one aspect of the present invention includes: a diagnosis portion which diagnoses, when the device is started up, whether an abnormality occurs in a component for setting that is externally connected; and a control portion which stops the startup of the device when the diagnosis portion diagnoses that an abnormality occurs, where the diagnosis portion diagnoses whether an abnormality occurs in which the capacitance value of the component for setting that is a capacitor falls outside a specified range, the semiconductor device further includes an external terminal which is connected to one end of the capacitor and the diagnosis portion includes a first constant current circuit which discharges the capacitor with a constant current via the external terminal, a discharge control portion which makes the first constant current circuit discharge the capacitor only for a first predetermined time, a second constant current circuit which charges the capacitor with the constant current via the external terminal, a charge control portion which makes the second constant current circuit charge the capacitor only for a second predetermined time and a comparator to which a voltage produced at the external terminal is input.

DETAILED DESCRIPTION OF THE PREFERRED EMBODIMENTS

An embodiment of the present invention will be described below with reference to drawings.

<Overall Configuration of Switching Power Supply Circuit>

Figure 1:
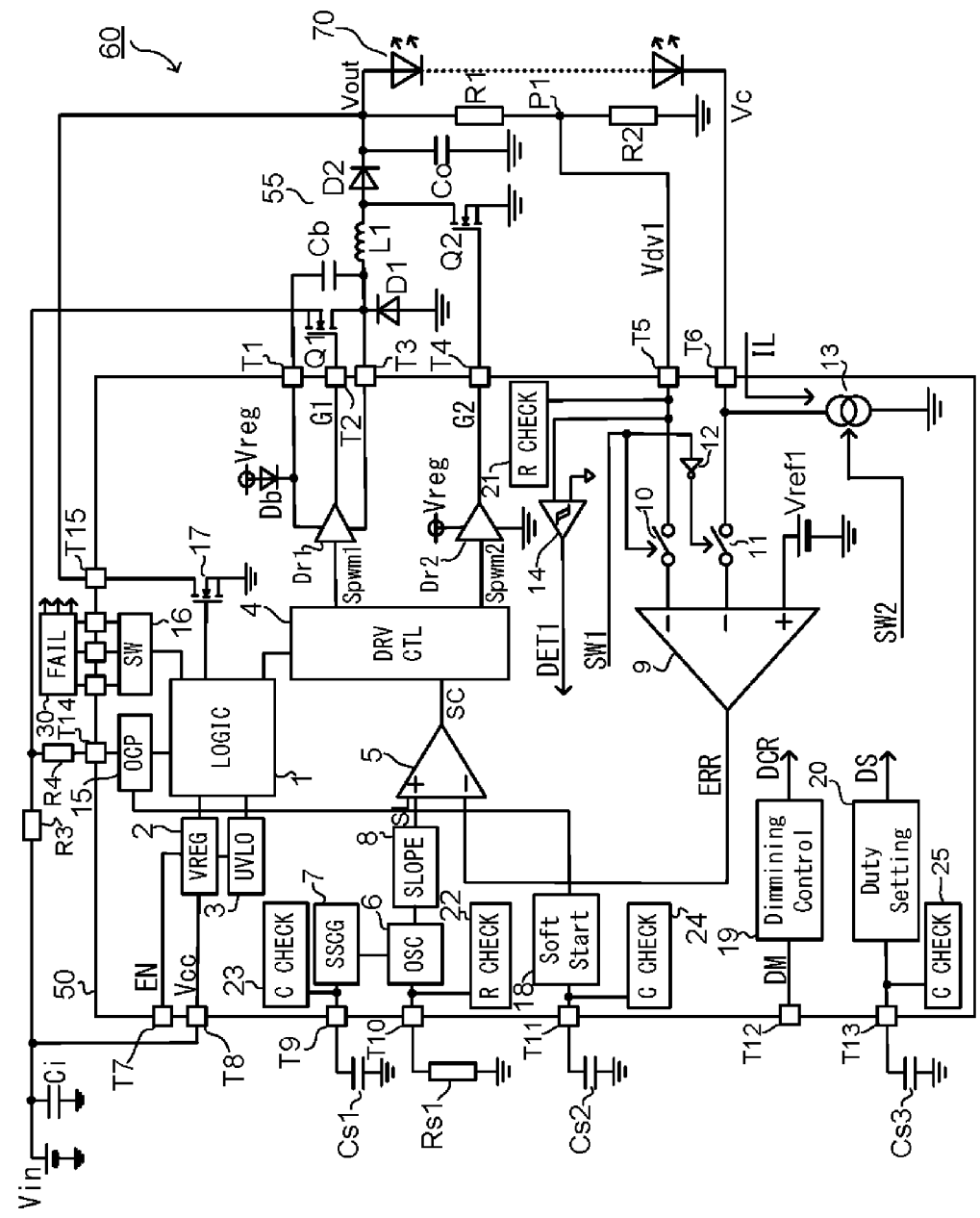
FIG. 1 is a diagram showing the overall configuration of a switching power supply circuit according to an embodiment of the present invention.

FIG. 1 is a diagram showing the overall configuration of a switching power supply circuit 60 for driving an LED 70 according to an embodiment of the present invention. The switching power supply circuit 60 is a DC/DC converter which mainly includes a semiconductor device 50 and an output stage 55. The switching power supply circuit 60 also includes an input capacitor Ci, a resistor R3, a resistor R4 and an abnormality flag output portion 30.

The output stage 55 provided outside the semiconductor device 50 includes a switching element Q1, a switching element Q2, a diode D1, a diode D2, a coil L1, a bootstrap capacitor Cb, an output capacitor Co, a resistor R1 and a resistor R2. The semiconductor device 50 functions as a switching driver IC which switches and drives the switching elements Q1 and Q2. The semiconductor device 50 can also be regarded as an LED driver IC (light-emitting device drive device).

The semiconductor device 50 includes a logic portion (control portion) 1, an internal power supply voltage generation portion 2, an UVLO (Under Voltage Lock Out) portion 3, a driver control portion 4, a comparator 5, an oscillator 6, a frequency spread portion 7, a slope voltage generation portion 8, an error amplifier 9, a switch 10, a switch 11, an inverter 12, a constant current control circuit 13, a comparator 14, an overcurrent protection circuit 15, a switch portion 16, a transistor 17, a soft start portion 18, a dimming control portion 19, a duty ratio setting portion 20, an external resistance diagnosis portion 21, an external resistance diagnosis portion 22 and external capacitance diagnosis portions 23 to 25. The semiconductor device 50 is formed by integrating these constituent elements. The semiconductor device 50 also includes external terminals T1 to T15 for establishing electrical connection to the outside.

An input voltage Vin is applied to one end of the input capacitor Ci, and the one end is connected to one end of the resistor R3. The other end of the resistor R3 is connected, together with one end of the resistor R4, to the drain of the switching element Q1 which is formed with an n-channel MOSFET. The other end of the resistor R4 is connected to the external terminal T14 which is included in the semiconductor device 50.

The cathode of the diode D1 is connected to the source of the switching element Q1. The cathode of the diode D1 is connected to the external terminal T3 which is included in the semiconductor device 50. The anode of the diode D1 is connected to an application end of a ground potential. The gate of the switching element Q1 is connected to the external terminal T2 which is included in the semiconductor device 50.

One end of the coil L1 is connected to the connection point of the switching element Q1 and the diode D1, and the anode of the diode D2 and the drain of the switching element Q2 which is formed with an n-channel MOSFET are connected together to the other end of the coil L1. The source of the switching element Q2 is connected to an application end of the ground potential. The gate of the switching element Q2 is connected to the external terminal T4 which is included in the semiconductor device 50. One end of the output capacitor Co is connected to the cathode of the diode D2, and the other end of the output capacitor Co is connected to an application end of the ground potential.

One end of the bootstrap capacitor Cb is connected to the connection point of the switching element Q1 and the coil L1. The other end of the bootstrap capacitor Cb is connected to the external terminal T1 which is included in the semiconductor device 50.

An output voltage Vout is produced at the connection point of the cathode of the diode D2 and the one end of the output capacitor Co. The resistor R1 and the resistor R2 for voltage division are connected in series between the connection point and an application end of the ground potential. The external terminal T5 which is included in the semiconductor device 50 is connected to the connection point P1 of the resistor R1 and the resistor R2. The anode side of the LED 70 is connected to the connection point of the cathode of the diode D2 and the one end of the output capacitor Co. The cathode side of the LED 70 is connected to the external terminal T6 which is included in the semiconductor device 50.

The connection point P1 of the resistor R1 and the resistor R2 is connected to the first inverting input terminal (−) of the error amplifier 9 through the external terminal T5 and the switch 10. The cathode side of the LED 70 is connected to the second inverting input terminal (−) of the error amplifier 9 through the external terminal T6 and the switch 11. A first reference voltage Vref1 is applied to the non-inverting input terminal (+) of the error amplifier 9.

The turning on and off of the switch 10 is switched by a first switching signal SW1 which is fed from the logic portion 1. The turning on and off of the switch 11 is switched by a signal obtained by inverting the logic of the first switching signal SW1 with the inverter 12. In other words, it is possible to switch between a state where the switch 10 is on and the switch 11 is off and a state where the switch 10 is off and the switch 11 is on according to the logic level of the first switching signal SW1.

The error amplifier 9 amplifies a difference between any one of a divided voltage Vdv1 obtained by dividing the output voltage Vout with the resistor R1 and the resistor R2 and a cathode voltage Vc of the LED 70 and the reference voltage Vref1, and outputs an error voltage ERR. The error voltage ERR is input to the inverting input terminal (−) of the comparator 5.

The slope voltage generation portion 8 generates a slope voltage SL which is formed in the shape of a sawtooth wave or a triangular wave in synchronism with clock signals output by the oscillator 6. The slope voltage SL is input to the non-inverting input terminal (+) of the comparator 5. The comparator 5 compares the error voltage ERR and the slope voltage SL, and outputs, to the driver control portion 4, a comparison signal SC which serves as the result of the comparison.

The driver control portion 4 produces, based on the comparison signal SC, a PWM (Pulse With Modulation) signal Spwm1 or Spwm2 whose duty ratio is adjusted and which is formed in the shape of pulses, and outputs each of them to a driver Dr1 or a driver Dr2.

The driver Dr1 uses, as a gate signal G1, a voltage obtained by adding the input voltage Vin to a voltage (=internal power supply voltage Vreg−forward voltage of diode Db) produced in the bootstrap capacitor Cb by charging with the internal power supply voltage Vreg, outputs it through the external terminal T2 to the gate of the switching element Q1 and thereby turns on the switching element Q1. The driver Dr1 outputs the gate signal G1 which short-circuits the gate and the source of the switching element Q1, and thereby turns off the switching element Q1. The driver Dr1 outputs the gate signal G1 according to the PWM signal Spwm1 from the driver control portion 4 so as to switch and drive the switching element Q1.

The driver Dr2 uses, as a gate signal G2, each of the internal power supply voltage Vreg and the ground potential, outputs it through the external terminal T4 to the gate of the switching element Q2 and thereby turns on and off the switching element Q2. The driver Dr2 outputs the gate signal G2 according to the PWM signal Spwm2 from the driver control portion 4 so as to switch and drive the switching element Q2.

Here, when the switching element Q2 is kept off by the driver Dr2, and the turning on and off of the switching element Q1 is controlled by the driver Dr1, a step-down mode is entered in which the input voltage Vin is stepped down and in which the output voltage Vout is output. On the other hand, when the switching element Q1 is kept on by the driver Dr1, and the turning on and off of the switching element Q2 is controlled by the driver Dr2, a step-up mode is entered in which the input voltage Vin is stepped up and in which the output voltage Vout is output. These modes are individually used depending on the number of stages of LED elements and the input voltage Vin in the application.

When the first switching signal SW1 is used to turn on the switch 10 and turn off the switch 11, the divided voltage Vdv1 obtained by dividing the output voltage Vout with the resistors R1 and R2 is input to the error amplifier 9. Hence, feedback control using the divided voltage Vdv1 as a feedback signal is performed, the duty ratio of the PWM signal Spwm1 or Spwm2 is adjusted by PWM control and control is performed such that the output voltage Vout is constant (first feedback control mode).

On the other hand, when the first switching signal SW1 is used to turn off the switch 10 and turn on the switch 11, the cathode voltage Vc of the LED 70 is input to the error amplifier 9. Hence, feedback control using the cathode voltage Vc as a feedback signal is performed, the duty ratio of the PWM signal Spwm1 or Spwm2 is adjusted by PWM control and control is performed such that the cathode voltage Vc is constant (second feedback control mode).

Figure 2:
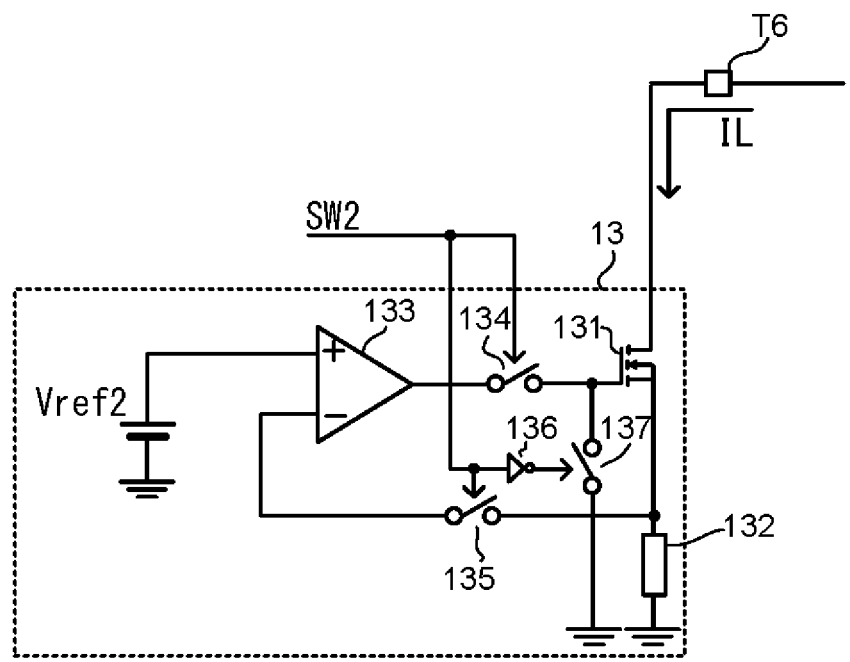
FIG. 2 is a diagram showing the configuration of a constant current control circuit according to the embodiment of the present invention.

Here, FIG. 2 is a diagram showing the specific configuration of the constant current control circuit 13. The constant current control circuit 13 includes a MOS transistor 131, a resistor 132, an error amplifier 133, a switch 134, a switch 135, an inverter 136 and a switch 137. The drain of the MOS transistor 131 formed with an n-channel MOSFET is connected to the external terminal T6 (FIG. 1) to which the cathode side of the LED 70 is connected. The source of the MOS transistor 131 is connected to one end of the resistor 132. The other end of the resistor 132 is connected to an application end of the ground potential. The connection point of the MOS transistor 131 and the resistor 132 is connected through the switch 135 to the inverting input terminal (−) of the error amplifier 133. A second reference voltage vref2 is applied to the non-inverting input terminal (+) of the error amplifier 133. The output end of the error amplifier 133 is connected through the switch 134 to the gate of the MOS transistor 131. The connection point of the switch 134 and the MOS transistor 131 is connected through the switch 137 to an application end of the ground potential.

The turning on and off of the switch 134 and the switch 135 is switched by a second switching signal SW2 which is fed from the logic portion 1. The turning on and off of the switch 137 is switched by a signal obtained by inverting the logic of the second switching signal SW2 with the inverter 136. In other words, it is possible to switch between a state where the switch 134 and the switch 135 are on and the switch 137 is off and a state where the switch 134 and the switch 135 are off and the switch 137 is on according to the logic level of the second switching signal SW2.

When the second switching signal SW2 is used to turn on the switch 134 and the switch 135 and turn off the switch 137, a current detection signal obtained by converting, with the resistor 132, a current IL flowing through the LED 70 and the MOS transistor 131 into a voltage is input to the error amplifier 133. Then, the error amplifier 133 outputs a signal obtained by amplifying a difference between the current detection signal and the second reference voltage vref2 to the MOS transistor 131, and thereby drives and controls the MOS transistor 131. In this way, constant current control in which the current IL becomes constant is performed.

On the other hand, when the second switching signal SW2 is used to turn off the switch 134 and the switch 135 and turn on the switch 137, the gate of the MOS transistor 131 is short-circuited to the ground potential, and thus the MOS transistor 131 is kept off. In this way, the current IL is interrupted.

The frequency spread portion 7 has the function of continuously changing the oscillation frequency of the clock signals produced by the oscillator 6 and spreading the oscillation frequency. In this way, it is possible to reduce the noise peak of radiated electromagnetic noise (EMI).

A dimming signal DM that serves as the PWM signal (pulse signal) whose duty ratio is adjusted is input from the outside through the external terminal T12 to the dimming control portion 19. The dimming control portion 19 produces, based on the dimming signal DM, a dimming control signal DCR, and outputs it to the logic portion 1. It is possible to adjust the brightness of dimming with the duty ratio of the dimming signal DM.

The duty ratio setting portion 20 produces a duty ratio setting signal DS and outputs it to the logic portion 1. The duty ratio setting signal DS indicates a threshold value of the duty ratio of the dimming signal DM.

The logic portion 1 compares the duty ratio of the dimming signal DM and the set threshold value based on the dimming control signal DCR and the duty ratio setting signal DS, and switches between the first feedback control mode and the second feedback control mode according to the result of the comparison.

When the duty ratio of the dimming signal DM is determined to be equal to or more than the threshold value, the logic portion 1 uses the first switching signal SW1 to turn off the switch 10 and turn on the switch 11, and thereby enables the second feedback control mode so that the cathode voltage Vc is constant. An example of various types of signal waveforms here is shown in FIG. 3.

Figure 3:
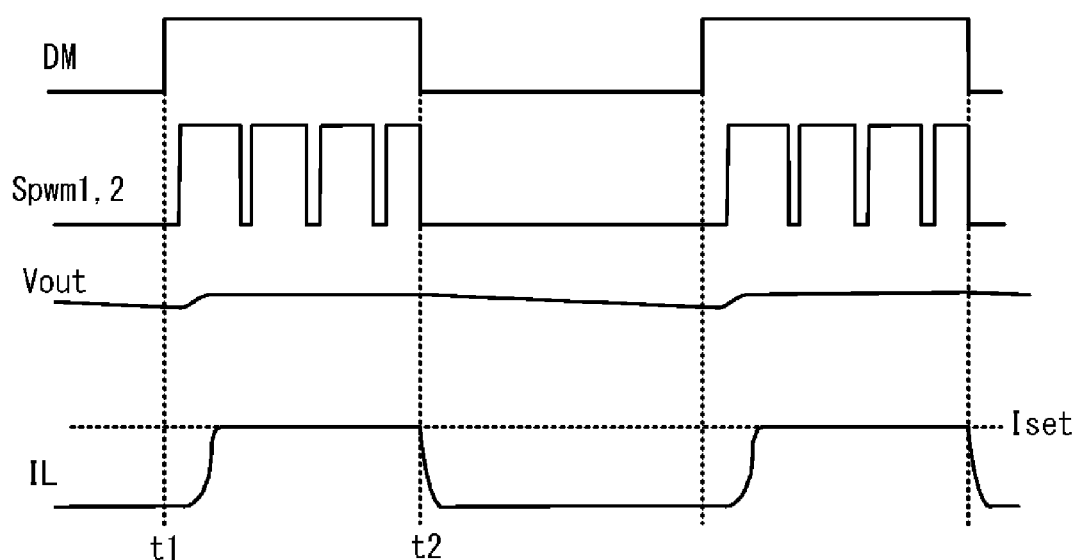
FIG. 3 is a timing chart showing an operation (a mode in which a dimming ratio is high) of the switching power supply circuit according to the embodiment of the present invention.

As shown in FIG. 3, when at a timing t1, the dimming signal DM rises to turn high, the logic portion 1 uses the second switching signal SW2 to turn on the switch 134 and the switch 135 and turn off the switch 137. In this way, the current IL rises to a setting current Iset. Here, since a forward voltage produced in the LED 70 is increased, for example, when the output voltage Vout is about 30V, for example, the cathode voltage Vc is about 1 V whereas when the first reference voltage Vref1 is set to 1 V, the PWM signal Spwm1 or Spwm2 is produced such that the cathode voltage Vc becomes constant to be 1 V. In this way, the turning on and off of the switching elements Q1 and Q2 is controlled.

When at a timing t2, the dimming signal DM falls while control is performed such that the current IL is constantly the setting current Iset, the logic portion 1 uses the second switching signal SW2 to turn off the switch 134 and the switch 135 and turn on the switch 137, with the result that the current IL is reduced to zero. Here, the forward voltage produced in the LED 70 is lowered, and in the example described above, for example, the cathode voltage Vc rises to about 10 V. Hence, the cathode voltage Vc is significantly higher than the first reference voltage Vref1 which is 1 V, the PWM signal Spwm1 or Spwm2 is kept low and the switching elements Q1 and Q2 are kept off.

Such an operation is repeatedly performed, and thus it is possible to perform bright dimming on the LED 70 while reducing a switching loss.

On the other hand, when the duty ratio of the dimming signal DM is determined to be lower than the threshold value, the logic portion 1 uses the first switching signal SW1 to turn on the switch 10 and turn off the switch 11, and thereby enables the first feedback control mode so that the output voltage Vout is constant. An example of various types of signal waveforms here is shown in FIG. 4.

Figure 4:
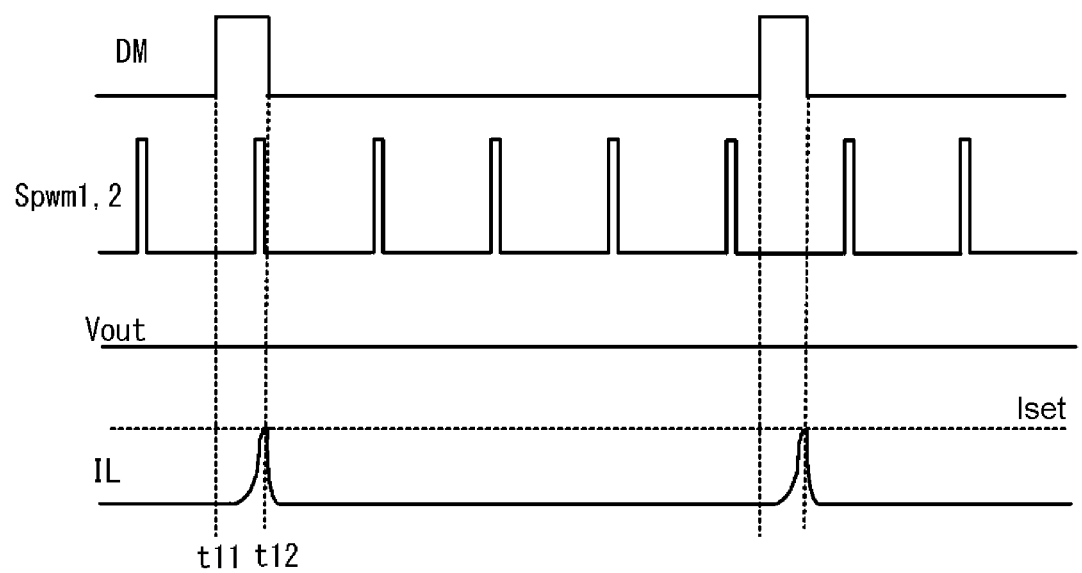
FIG. 4 is a timing chart showing an operation (a mode in which the dimming ratio is low) of the switching power supply circuit according to the embodiment of the present invention.

As shown in FIG. 4, at a timing t11 when the dimming signal DM rises, the logic portion 1 uses the second switching signal SW2 to turn on the switch 134 and the switch 135 and turn off the switch 137, and thus the current IL rises to the setting current Iset. Then, when at a timing t12, the dimming signal DM falls while control is performed such that the current IL is constantly the setting current Iset, the logic portion 1 uses the second switching signal SW2 to turn off the switch 134 and the switch 135 and turn on the switch 137, with the result that the current IL is reduced to zero. Such an operation is repeatedly performed, and thus it is possible to perform dark dimming on the LED 70.

Here, since the first feedback control mode is enabled, regardless of the level of the dimming signal DM (the turning on and off of the current IL), the PWM signal Spwm1 or Spwm2 is constantly produced such that the output voltage Vout is constant. When the duty ratio of the dimming signal DM is low, if the second feedback control mode is enabled, the PWM signal Spwm1 or Spwm2 is produced only in a short period during which the dimming signal DM is high, with the result that it is impossible to keep the output voltage Vout at a predetermined level. Hence, when the duty ratio of the dimming signal DM is low, the first feedback control mode is enabled such that the output voltage Vout can be kept at the predetermined level.

When a coil current flowing through the coil L1 which is detected by a voltage signal input through the external terminal T14 reaches a predetermined overcurrent setting value, the overcurrent protection circuit 15 provides an instruction to the logic portion 1. In this way, according to the instruction from the logic portion 1, the driver control portion 4 forcefully makes the PWM signal Spwm1 or Spwm2 fall to turn low, and thus the switching elements Q1 and Q2 are turned off. Hence, the coil current is limited so as to be prevented from exceeding the overcurrent setting current.

The soft start portion 18 performs control such that a current limit value in the overcurrent protection circuit 15 is gradually increased when the semiconductor device 50 is started up. In this way, the peak of the coil current is gradually increased, and then the coil current reaches a steady state.

The comparator 14 compares the divided voltage Vdv1 obtained by dividing the output voltage Vout with a predetermined reference voltage, and when the divided voltage Vdv1 exceeds the reference voltage, the comparator 14 outputs, to the logic portion 1, a comparison signal DET1 whose logic level indicates that the divided voltage Vdv1 exceeds the reference voltage. Accordingly, the logic portion 1 performs control such that the switching element Q1 or Q2 is turned off. In this way, overvoltage protection for limiting the output voltage Vout to the overvoltage setting value or less is performed.

A power supply voltage Vcc based on the input voltage Vin is input to the internal power supply voltage generation portion 2 through the external terminal T8 from the outside, and the internal power supply voltage generation portion 2 generates the internal power supply voltage Vreg based on the power supply voltage Vcc. The internal power supply voltage Vreg is supplied to the individual portions including the logic portion 1.

When an enable signal EN indicating enabling is input to the internal power supply voltage generation portion 2 through the external terminal T7 from the outside, the internal power supply voltage generation portion 2 makes the internal power supply voltage Vreg rise. While the internal power supply voltage Vreg does not reach a predetermined UVLO cancellation voltage, the UVLO portion 3 keeps the logic portion 1 in a standby state. Then, when the internal power supply voltage Vreg reaches the UVLO cancellation voltage, the UVLO portion 3 cancels the standby state of the logic portion 1. In this way, the semiconductor device 50 is started up.

When an enable signal EN indicating disabling is input to the internal power supply voltage generation portion 2, the internal power supply voltage generation portion 2 makes the internal power supply voltage Vreg fall. When the internal power supply voltage Vreg drops below a predetermined UVLO detection voltage, the UVLO portion 3 brings the logic portion 1 into the standby state. In this way, the switching elements Q1 and Q2 are kept off, and the semiconductor device 50 is brought into a power-off state. Here, the logic portion 1 turns on the transistor 17 so as to discharge the output capacitor Co through the external terminal T15. In this way, it is possible to reliably change the output voltage Vout to 0 V.

The switch portion 16 and the abnormality flag output portion 30 form an error signal output portion which outputs an error signal to the outside when an abnormality is detected, and the details thereof will be described later.

<Self-Diagnosis Function of External Component for Setting>

Here, the resistor R2 for voltage division which is provided outside the semiconductor device 50 functions as a resistor for setting that sets the target voltage of the output voltage Vout in the first feedback control mode and that sets the overvoltage setting value.

A resistor Rs1 which is externally connected to the oscillator 6 through the external terminal T10 functions as a resister for setting that sets the oscillation frequency of the oscillator 6.

A capacitor Cs1 which is connected to the frequency spread portion 7 through the external terminal T9 functions as a capacitor for setting that sets a variation range or a variation period of the oscillation frequency produced by the frequency spread portion 7.

A capacitor Cs2 which is connected to the soft start portion 18 through the external terminal T11 functions as a capacitor for setting that sets a soft start time (the rising time of the output voltage Vout).

A capacitor Cs3 which is connected to the duty ratio setting portion 20 through the external terminal T13 functions as a capacitor for setting that sets the threshold value of the duty ratio of the dimming signal DM for switching between the first feedback control mode and the second feedback control mode.

Since the resisters for setting and the capacitors for setting described above are externally connected, the connection may be disconnected or a resistance value or a capacitance value may be erroneously set. Hence, the semiconductor device 50 of the present embodiment has a self-diagnosis function of diagnosing whether these external components for setting are in an abnormal state when the device is started up, and it will be described with reference to a flowchart shown in FIG. 5.

Figure 5:
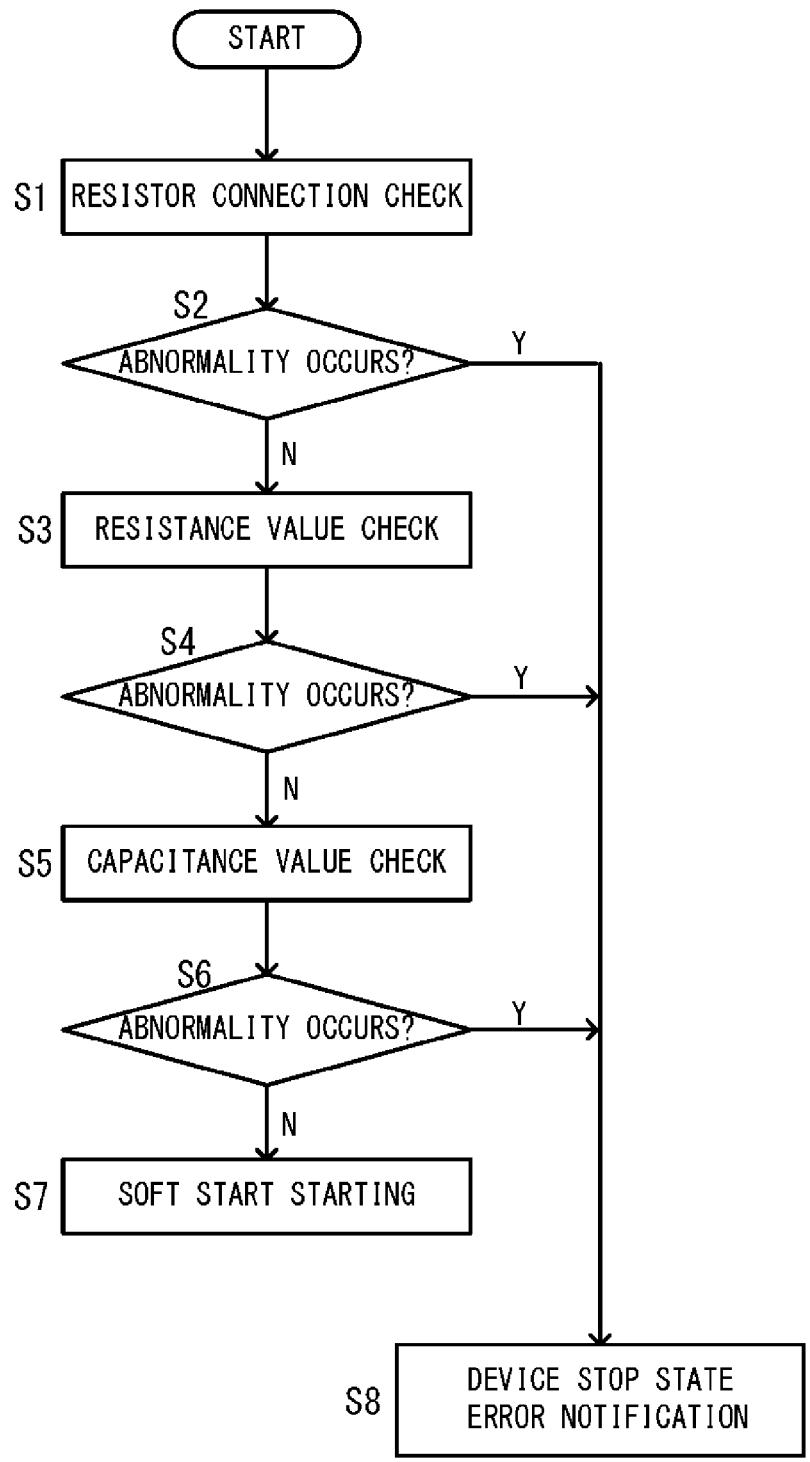
FIG. 5 is a flowchart on self-diagnosis processing according to the embodiment of the present invention.

The flowchart of FIG. 5 is started when the standby state of the logic portion 1 is cancelled by the UVLO portion 3 and the semiconductor device 50 is started up.

Figure 6:
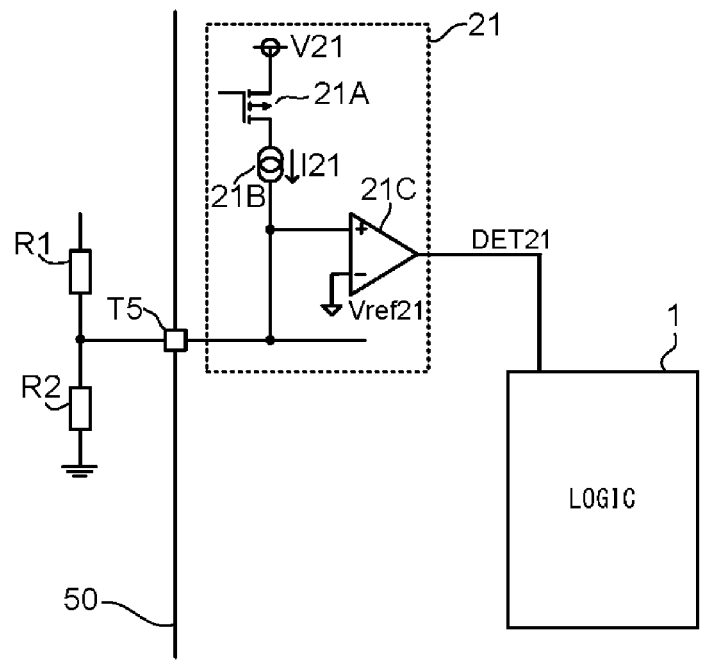
FIG. 6 is a diagram showing the configuration of an external resistance diagnosis portion according to the embodiment of the present invention.

First, in step S1, whether the connection of the resistor R2 for voltage division is disconnected is diagnosed. This diagnosis is performed with the external resistance diagnosis portion 21. The configuration of the external resistance diagnosis portion 21 is shown in FIG. 6. The external resistance diagnosis portion 21 includes a transistor 21A, a constant current circuit 21B and a comparator 21C.

A predetermined power supply voltage V21 is applied to the source of the transistor 21A formed with a p-channel MOSFET. The drain of the transistor 21A is connected to one end of the constant current circuit 21B. The other end of the constant current circuit 21 is connected through the external terminal T5 to the connection point of the resistors R1 and R2 and is also connected to the non-inverting input terminal (+) of the comparator 21C. A reference voltage Vref21 is applied to the inverting input terminal (−) of the comparator 21C. The comparator 21C outputs a detection signal DET21 to the logic portion 1.

In step S1, the logic portion 1 applies the gate signal to the transistor 21A to turn on the transistor 21A, and thereby attempts to generate a constant current I21. Here, when the connection of the resistor R2 is normal, a voltage based on a voltage drop produced as a result of the constant current I21 flowing through the resistor R2 is applied to the non-inverting input terminal of the comparator 21C, with the result that the detection signal DET21 which is the output of the comparator 21 is turned low. On the other hand, when the connection of the resistor R2 is disconnected, the constant current I21 does not flow, and thus the power supply voltage V21 is applied to the non-inverting input terminal of the comparator 21, with the result that the detection signal DET21 is turned high. As described above, by the logic level of the detection signal DET21, it is possible to diagnose whether the connection of the resistor R2 is disconnected.

The logic portion 1 determines, according to the logic level of the detection signal DET21, whether or not the connection of the resistor R2 is abnormal (step S2), and when it is abnormal (Y in step S2), the process proceeds to step S8. In step 8, the logic portion 1 stops the startup of the semiconductor device 50. The logic portion 1 also uses the switch portion 16 and the abnormality flag output portion 30 to notify an error signal to the outside.

Figure 9:
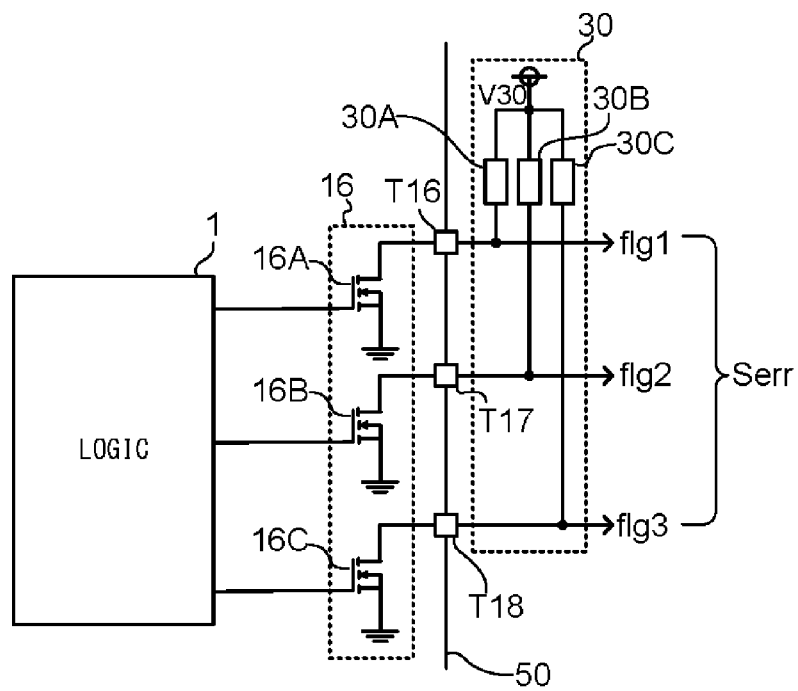
FIG. 9 is a diagram showing the configuration of an error signal output portion according to the embodiment of the present invention.

Here, the configuration of the switch portion 16 and the abnormality flag output portion 30 will be shown in FIG. 9. The switch portion 16 includes a transistor 16A, a transistor 16B and a transistor 16C. These transistors each are formed with an re-channel MOSFET. The abnormality flag output portion 30 includes a power supply voltage V30, a resistor 30A, a resistor 30B and a resistor 30C.

The drain of the transistor 16A is connected to one end of the resistor 30A for pull-up through the external terminal T16 which is included in the semiconductor device 50. The drain of the transistor 16B is connected to one end of the resistor 30B for pull-up through the external terminal T17 which is included in the semiconductor device 50. The drain of the transistor 16C is connected to one end of the resistor 30C for pull-up through the external terminal T18 which is included in the semiconductor device 50. The power supply voltage V30 is applied to the other ends of the resistors 30A to 30C.

The turning on and off of the transistor 16A is switched by the logic portion 1, and accordingly, the low and high levels of an abnormality flag signal flg1 are switched, and the abnormality flag signal flg1 is output from the external terminal T16 through the abnormality flag output portion 30. The turning on and off of the transistor 16B is switched by the logic portion 1, and accordingly, the low and high levels of an abnormality flag signal flg2 are switched, and the abnormality flag signal flg2 is output from the external terminal T17 through the abnormality flag output portion 30. The turning on and off of the transistor 16C is switched by the logic portion 1, and accordingly, the low and high levels of an abnormality flag signal flg3 are switched, and the abnormality flag signal flg3 is output from the external terminal T18 through the abnormality flag output portion 30.

In other words, by a combination of the turning on and off of the transistors 16A to 16C controlled by the logic portion 1, a three-bit error signal Serr formed with the abnormality flag signals flg1 to flg3 is produced. Different pieces of bit data of the error signal Serr are produced according to the types of abnormalities such as when an overvoltage is produced, when an overcurrent is produced and when step S8 is performed by self-diagnosis.

When the semiconductor device 50 is used as, for example, a vehicle-mounted semiconductor device 50, the error signal Serr is fed to, for example, a microcomputer which is included in an ECU (Electronic Control Unit).

Figure 7:
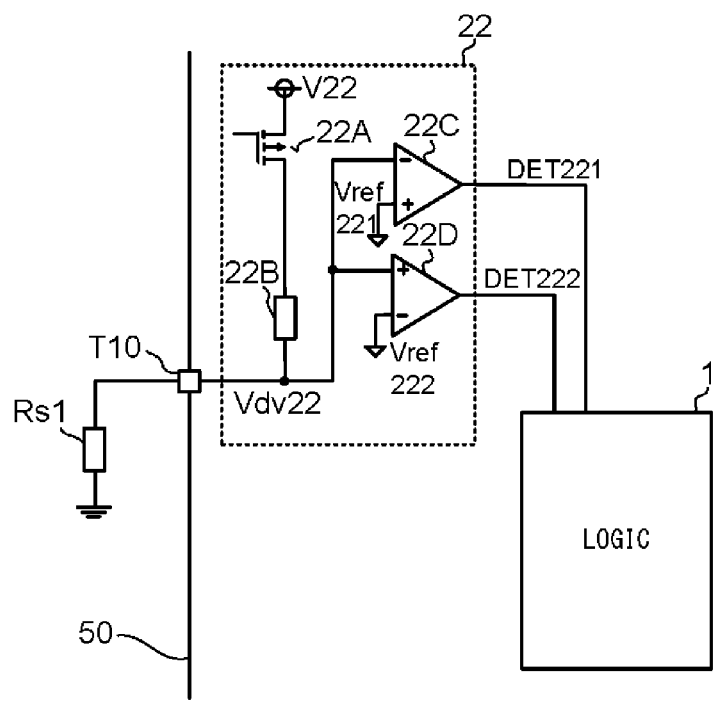
FIG. 7 is a diagram showing the configuration of an external resistance diagnosis portion according to the embodiment of the present invention.

With reference back to the flowchart of FIG. 5, when no abnormality occurs in the connection of the resistor R2 in step S2 (N in step S2), the process proceeds to step S3. In step S3, whether the resistance value of the external resistor Rs1 falls within a specified range is diagnosed. This diagnosis is performed with the external resistance diagnosis portion 22. The configuration of the external resistance diagnosis portion 22 is shown in FIG. 7. The external resistance diagnosis portion 22 includes a transistor 22A, a resistor 22B, a first comparator 22C and a second comparator 22D.

A power supply voltage V22 is applied to the source of the transistor 22A formed with a p-channel MOSFET. The drain of the transistor 22A is connected to one end of the resistor 22B. The other end of the resistor 22B is connected through the external terminal T10 to one end of the resistor Rs1, and is also connected to the inverting input terminal (−) of the first comparator 22C and the non-inverting input terminal (+) of the second comparator 22D. A first reference voltage Vref221 is applied to the non-inverting input terminal (+) of the first comparator 22C. A second reference voltage Vref222 is applied to the inverting input terminal (−) of the second comparator 22D. The first comparator 22C outputs a first detection signal DET221 to the logic portion 1. The second comparator 22D outputs a second detection signal DET222 to the logic portion 1.

In step S3, the logic portion 1 turns on the transistor 22A. In this way, a divided voltage Vdv22 obtained by dividing the power supply voltage V22 with the resistor 22B and a resistor Rsc1 is monitored by the first comparator 22C and the second comparator 22D. When the resistance value of the resistor Rs1 exceeds the upper limit value of the specified range, the second detection signal DET222 which is the output of the second comparator 22D is turned high. When the resistance value of the resistor Rs1 drops below the lower limit value of the specified range, the first detection signal DET221 which is the output of the first comparator 22C is turned high. When the resistance value of the resistor Rs1 is equal to or more than the upper limit value but equal to or less than the lower limit value, both the first detection signal DET221 and the second detection signal DET222 are turned low.

Hence, when any one of the first detection signal DET221 and the second detection signal DET222 is high, the resistance value of the resistor Rs1 is in an abnormal state so as to fall outside the specified range whereas when both of them are low, the resistance value is normal so as to fall within the specified range.

Based on the first detection signal DET221 and the second detection signal DET222, the logic portion 1 determines whether or not the setting of the resistance value of the resistor Rs1 is abnormal (step S4), and when the setting is abnormal (Y in step S4), the process proceeds to step S8, the startup is stopped and the error signal Serr is output to the outside.

Figure 8:
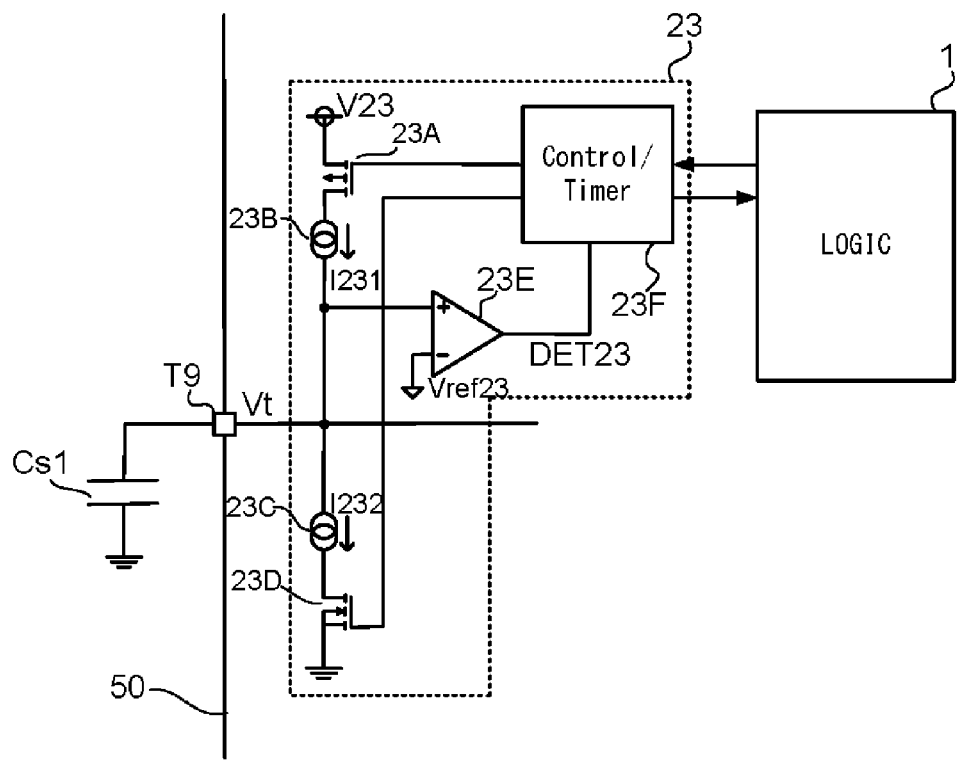
FIG. 8 is a diagram showing the configuration of an external capacity diagnosis portion according to the embodiment of the present invention.

On the other hand, when the setting of the resistance value of the resistor Rs1 is not abnormal (N in step S4), the process proceeds to step S5. In step S5, whether the capacitance values of the external capacitors Cs1 to Cs3 fall within a specified range is diagnosed. This diagnosis is performed with the external capacitance diagnosis portions 23 to 25. Here, the configuration of the external capacitance diagnosis portion 23 which diagnoses the capacitance value of the capacitor Cs1 is shown in FIG. 8.

The external capacitance diagnosis portion 23 includes a transistor 23A, a constant current circuit 23B, a constant current circuit 23C, a transistor 23D, a comparator 23E and a control portion/timer portion 23F. A power supply voltage V23 is applied to the source of the transistor 23A formed with a p-channel MOSFET. The drain of the transistor 23A is connected to one end of the constant current circuit 23B. The other end of the constant current circuit 23B is connected through the external terminal T9 to one end of the capacitor Cs1, and is also connected to the non-inverting input terminal (+) of the comparator 23E. A reference voltage Vref23 is applied to the inverting input terminal (−) of the comparator 23E. The external terminal T9 is connected to one end of the constant current circuit 23C. The other end of the constant current circuit 23C is connected to the drain of the transistor 23D formed with an n-channel MOSFET. The source of the transistor 23D is connected to an application end of the ground potential. The comparator 23E outputs a detection signal DET23 to the control portion/timer portion 23F.

Capacitance value diagnosis processing which is performed with the external capacitance diagnosis portion 23 will be described with reference to a flowchart shown in FIG. 10.

Figure 10:
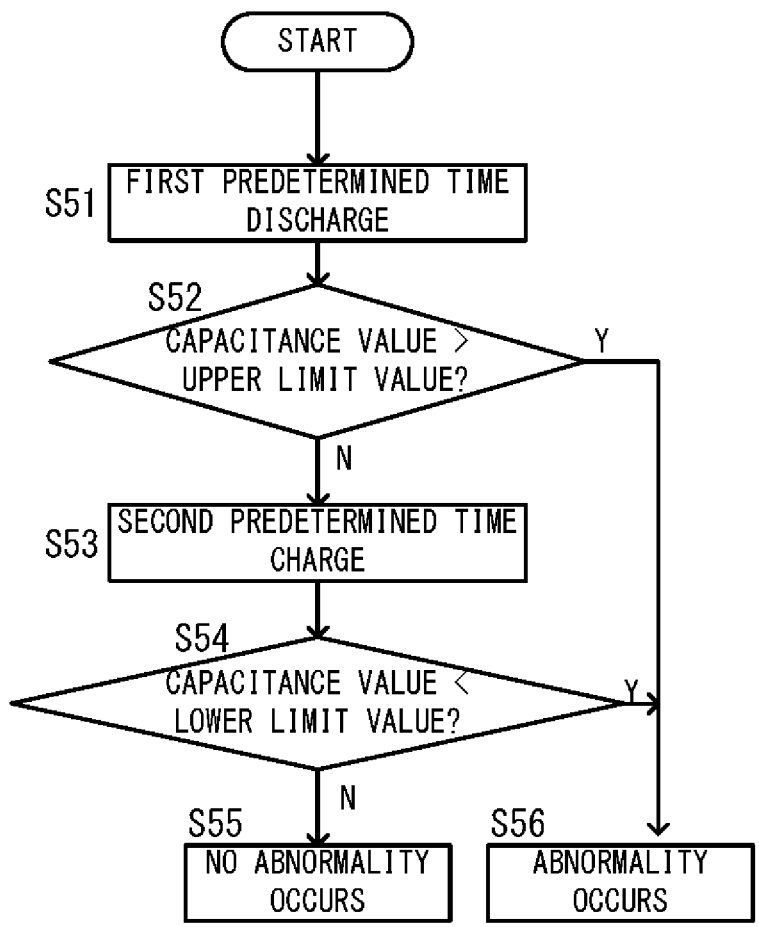
FIG. 10 is a flowchart on capacitance value diagnosis processing according to the embodiment of the present invention.

When the flowchart of FIG. 10 is started, first, in step S51, the logic portion 1 provides an instruction to start capacitance diagnosis to the control portion/timer portion 23F. In this way, the control portion/timer portion 23F turns off the transistor 23A and turns on the transistor 23D only for a first predetermined time. Thus, discharge is performed from the capacitor Cs1 with a constant current I232 for the first predetermined time through the external terminal T9 and the transistor 23D. Then, in step S52, when the first predetermined time has elapsed, the control portion/timer portion 23F turns off the transistor 23A and turns off the transistor 23D so as to stop the discharge. Here, the control portion/timer portion 23F checks the detection signal DET23 which is the output of the comparator 23E.

When the semiconductor device 50 is restarted after the semiconductor device 50 is brought into the power-off state, charge is left in the capacitor Cs1. A drop rate which is caused by the discharge of a terminal voltage Vt produced at the external terminal T9 is determined from the current value of the constant current I232 and the capacitance upper limit value in the specified range of the capacitor Cs1. The first predetermined time is determined from the drop rate and the voltage produced by the charge left in the capacitor Cs1 at the time of restart as a time until the terminal voltage Vt becomes 0 V (zero charge) by the discharge.

Hence, when the capacitance value of the capacitor Cs1 is equal to or less than the capacitance upper limit value, the terminal voltage Vt reaches 0 V within the first predetermined time by the discharge. In this case, when the first predetermined time has elapsed, the terminal voltage Vt is 0 V, and thus the detection signal DET23 which is the output of the comparator 23E is turned low. On the other hand, when the capacitance value of the capacitor Cs1 is higher than the capacitance upper limit value, even if the discharge is performed only for the first predetermined time, the voltage drop rate is low, with the result that the terminal voltage Vt is higher than 0 V. Hence, the detection signal DET23 which is the output of the comparator 23E is turned high. In other words, in step S52, the control portion/timer portion 23F can determine, based on the logic level of the detection signal DET23, whether the capacitance value of the capacitor Cs1 is higher than the capacitance upper limit value.

When the capacitance value is higher than the capacitance upper limit value (Y in step S52), the process proceeds to step S56, the control portion/timer portion 23F outputs, to the logic portion 1, a diagnosis result signal indicating that the capacitance value is abnormal and the process of FIG. 10 is completed. On the other hand, when the capacitance value is equal to or less than the capacitance upper limit value (N in step S52), the process proceeds to step S53.

In step S53, the control portion/timer portion 23F turns on the transistor 23A and turns off the transistor 23D only for a second predetermined time. In this way, charge is performed from the power supply voltage V23 through the transistor 23A and the external terminal T9 with a constant current I231 for the second predetermined time. Then, in step S54, when the second predetermined time has elapsed, the control portion/timer portion 23F turns off the transistor 23A and turns off the transistor 23D so as to stop the charge. Here, the control portion/timer portion 23F checks the detection signal DET23.

By the discharge described previously, the terminal voltage Vt is 0 V. An increase rate which is caused by the charge of the terminal voltage Vt produced at the external terminal T9 is determined from the current value of the constant current I231 and the capacitance lower limit value in the specified range of the capacitor Cs1. The second predetermined time is determined based on the increase rate as a time until the terminal voltage Vt becomes the power supply voltage V23 from the 0 V by the charge.

Hence, when the capacitance value of the capacitor Cs1 is lower than the capacitance lower limit value, the charge is completed within the second predetermined time, and the terminal voltage Vt reaches the power supply voltage V23. In this case, when the second predetermined time has elapsed, the terminal voltage Vt is the power supply voltage V23, and thus the detection signal DET23 which is the output of the comparator 23E is turned high. On the other hand, when the capacitance value of the capacitor Cs1 is equal to or more than the capacitance lower limit value, even if the charge is performed only for the second predetermined time, the voltage increase rate is low, with the result that the terminal voltage Vt does not reach the power supply voltage V23. Hence, the detection signal DET23 which is the output of the comparator 23E is turned low. In other words, in step S54, the control portion/timer portion 23F can determine, based on the logic level of the detection signal DET23, whether the capacitance value of the capacitor Cs1 is lower than the capacitance lower limit value. Here, the reference voltage vref23 is switched by the control portion/timer portion 23F to a voltage value which is different from that in step S52.

When the capacitance value is lower than the capacitance lower limit value (Y in step S54), the process proceeds to step S56, the control portion/timer portion 23F outputs, to the logic portion 1, the diagnosis result signal indicating that the capacitance value is abnormal and the process of FIG. 10 is completed. On the other hand, when the capacitance value is equal to or more than the capacitance lower limit value (N in step S54), the process proceeds to step S55, the control portion/timer portion 23F outputs, to the logic portion 1, a diagnosis result signal indicating that the capacitance value falls within the specified range so as not to be abnormal and the process of FIG. 10 is completed.

The configuration (FIG. 8) of the external capacitance diagnosis portion 23 described above is the same as those of the external capacitance diagnosis portions 24 and 25. Capacitance value diagnosis processing on the capacitors Cs2 and Cs3 using the external capacitance diagnosis portions 24 and 25 is the same as that in FIG. 10 described above.

Although in step S5 in the flowchart of FIG. 5, the capacitance value diagnoses on the capacitors Cs1 to Cs3 described above are sequentially performed, when it is determined partway through the diagnoses that the capacitance value is abnormal, the following diagnoses on the capacitors are not performed, and in step S6, the logic portion 1 determines that an abnormality occurs in the capacitance value. When no abnormality occurs in all the capacitance values of the capacitors Cs1 to Cs3, in step S6, the logic portion 1 determines that no abnormality occurs in the capacitance value.

When in step S6, it is determined that an abnormality occurs in the capacitance value (Y in step S6), the process proceeds to step S8, the startup is stopped and the error signal Serr is output to the outside. On the other hand, when in step S6, it is determined that no abnormality occurs in the capacitance value (N in step S6), the process proceeds to step S7. In step S7, by the control of the logic portion 1, the switching and driving of the switching element Q1 or Q2 is started, and the soft start is started by the soft start portion 18. In this way, the output voltage Vout rises from 0 V. Since the soft start is started after the diagnosis of the capacitor Cs2 for setting of the soft start portion 18 is performed, it is possible to prevent a problem in which the soft start time is abnormally shortened so as to overshoot the output voltage Vout and in which thus overvoltage protection is not performed in time.

As described above, in the present embodiment, when the semiconductor device 50 is started up, whether an abnormality occurs in the resistor R2, the resistor Rs1 and the capacitors Cs1 to Cs3 which are external components for setting is sequentially diagnosed, and thus when an abnormality is detected, it is possible to stop the startup of the device so as to previously prevent an erroneous operation.

As a variation of the present embodiment, the following configuration may be adopted. For example, in the configuration of the external resistance diagnosis portion 22 shown in FIG. 7, when the connection of the external resistor Rs1 is disconnected, the external terminal T10 is opened, and thus the second detection signal DET222 which is the output of the second comparator 22D is turned high. Hence, the external resistance diagnosis portion 22 can detect not only an abnormality in the resistance value of the resistor Rs1 but also an abnormality in which the connection of the external resistor Rs1 is disconnected. In this way, the same configuration as the external resistance diagnosis portion 22 may be used for the diagnosis of the resistor R2 for voltage division. In this case, it is possible to also detect an abnormality in which the resistance value of the resistor R2 is lower than the lower limit value.

There is no limitation to the order (steps S1, S3 and S5) of the diagnoses of the external components for setting shown in FIG. 5, and any order may be adopted.

Although in the embodiment described above, even when an abnormality occurs in any one of the external components for setting, in step S8 (FIG. 5), in the configuration shown in FIG. 9, the error signal Serr of the same bit data is output in the same manner, a different piece of bit data of the error signal Serr may be used for each of the components for setting in which an abnormality occurs. In this way, it is possible to notify in which one of the components for setting an abnormality occurs. Although when the number of bits is three as shown in FIG. 9, eight different types of abnormalities can be notified, the number of bits may be increased when the number of bits are not sufficient.

<Application to Liquid Crystal Display Device (LCD)>

Figure 11:
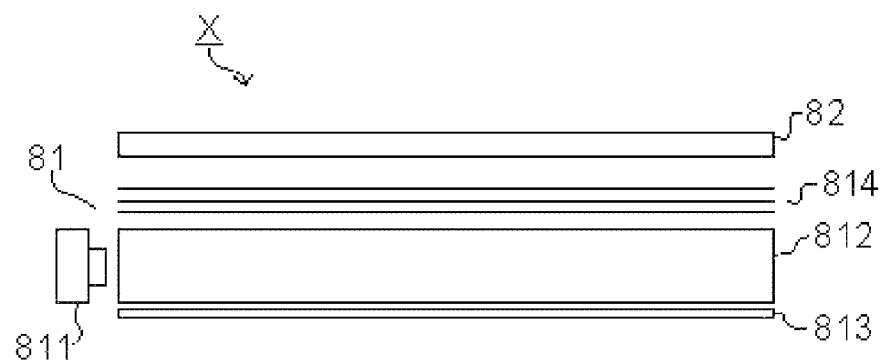
FIG. 11 is a side view showing a schematic configuration of a liquid crystal display device according to the embodiment of the present invention.

As an example of the target to which the semiconductor device (switching power supply circuit) of the embodiment described above is applied, a liquid crystal display device will be described. An example of the configuration of the liquid crystal display device is shown in FIG. 11. Although the configuration shown in FIG. 11 is a so-called edge light system configuration, there is no limitation to this configuration and a direct system configuration may be adopted.

The liquid crystal display device X shown in FIG. 11 includes a backlight 81 and a liquid crystal panel 82. The backlight 81 is an illumination device (an example of a light-emitting device) which illuminates the liquid crystal panel 82 from behind. The backlight 81 includes an LED light source portion 811, a light guide plate 812, a reflective plate 813 and optical sheets 814.

The LED light source portion 811 includes LEDs and a substrate on which the LEDs are mounted, as a switching power supply circuit for driving the LEDs, the switching power supply circuit of the embodiment described above can be applied. Light emitted from the LED light source portion 811 enters the interior of the light guide plate 812 from its side surface. In the light guide plate 812 formed with, for example, an acrylic plate, the light entering the interior is guided to the entire interior while being totally reflected, and the light is emitted as planar light from the surface on the side where the optical sheets 814 are arranged. The reflective plate 813 reflects light leaking from the light guide plate 812 so as to return the light to the interior of the light guide plate 812. The optical sheets 814 are formed with a diffusion sheet, a lens sheet and the like, and are intended to, for example, uniformize and enhance the brightness of light which illuminates the liquid crystal panel 82.

<Vehicle-Mounted Display>

The liquid crystal display device to which the semiconductor device of the embodiment described above is applied is preferably applied to a vehicle-mounted display in particular. In view of the conditions in which ISO26262 that is an international standard on the safety of electrical/electronic functions in automobiles and the like are established, the technology which previously prevents an erroneous operation as described above is important in terms of safety.

Figure 12:
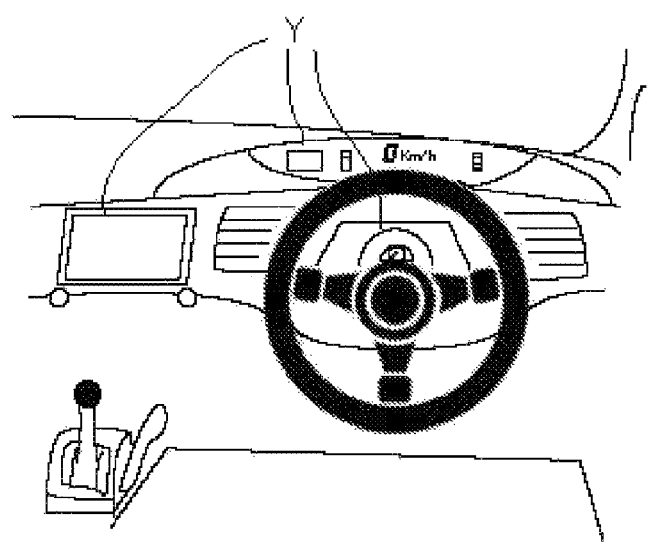
FIG. 12 is a diagram showing how a vehicle-mounted display according to the embodiment of the present invention is provided in a vehicle.

For example, as a vehicle-mounted display Y shown in FIG. 12, the vehicle-mounted display is provided in a dashboard in front of the driver's seat of a vehicle. The vehicle-mounted display Y displays, for example, car navigation information, an image shot behind the vehicle and various types of images in a speed meter, a tachometer, a fuel meter, a fuel consumption meter, a shift position and the like, and thereby can convey various types of information to users.

<Others>

The embodiment discussed above should be considered to be illustrative in all respects and not restrictive, the technical range of the present invention is indicated not by the description of the embodiment discussed above but by the scope of claims and it should be understood that meanings equivalent to the scope of claims and all modifications belonging to the scope are included.

What is claimed is:

1. A semiconductor device comprising:
a diagnosis portion which diagnoses, when the device is started up, whether an abnormality occurs in a component for setting that is externally connected; and
a control portion which stops the startup of the device when the diagnosis portion diagnoses that an abnormality occurs,
wherein the diagnosis portion diagnoses whether an abnormality occurs in which connection of the component for setting that is a resistor is disconnected,
the semiconductor device further comprises an external terminal which is connected to one end of the resistor and
the diagnosis portion includes a constant current circuit which passes a constant current through the resistor via the external terminal, a comparator to which a voltage produced at the external terminal is input and a transistor which switches between connection and interruption of a path along which the constant current is passed.

2. A semiconductor device comprising:
a diagnosis portion which diagnoses, when the device is started up, whether an abnormality occurs in a component for setting that is externally connected; and
a control portion which stops the startup of the device when the diagnosis portion diagnoses that an abnormality occurs,
wherein the diagnosis portion diagnoses whether an abnormality occurs in which a resistance value of the component for setting that is a resistor falls outside a specified range,
the semiconductor device further comprises an external terminal which is connected to one end of the resistor and
the diagnosis portion includes a voltage dividing resistor, one or two comparators to which a voltage produced at the external terminal by performing voltage division with the voltage dividing resistor and the resistor is input and a transistor which switches between connection and interruption of a path along which a power supply voltage is applied to the voltage dividing resistor.

3. A semiconductor device comprising:
a diagnosis portion which diagnoses, when the device is started up, whether an abnormality occurs in a component for setting that is externally connected; and
a control portion which stops the startup of the device when the diagnosis portion diagnoses that an abnormality occurs,
wherein the diagnosis portion diagnoses whether an abnormality occurs in which a capacitance value of the component for setting that is a capacitor falls outside a specified range,
the semiconductor device further comprises an external terminal which is connected to one end of the capacitor and
the diagnosis portion includes a first constant current circuit which discharges the capacitor with a constant current via the external terminal, a discharge control portion which makes the first constant current circuit discharge the capacitor only for a first predetermined time, a second constant current circuit which charges the capacitor with the constant current via the external terminal, a charge control portion which makes the second constant current circuit charge the capacitor only for a second predetermined time and a comparator to which a voltage produced at the external terminal is input.

4. The semiconductor device according to claim 1,
wherein the diagnosis portion further diagnoses whether an abnormality occurs in which a resistance value of the component for setting that is a resistor falls outside a specified range, the semiconductor device further comprises the external terminal which is connected to the one end of the resistor and the diagnosis portion includes a voltage dividing resistor, one or two comparators to which a voltage produced at the external terminal by performing voltage division with the voltage dividing resistor and the resistor is input and a transistor which switches between connection and interruption of a path along which a power supply voltage is applied to the voltage dividing resistor.

5. The semiconductor device according to claim 4, wherein the diagnosis portion further diagnoses whether an abnormality occurs in which a capacitance value of the component for setting that is a capacitor falls outside a specified range, the semiconductor device further comprises an external terminal which is connected to one end of the capacitor and the diagnosis portion includes a first constant current circuit which discharges the capacitor with a constant current via the external terminal, a discharge control portion which makes the first constant current circuit discharge the capacitor only for a first predetermined time, a second constant current circuit which charges the capacitor with the constant current via the external terminal, a charge control portion which makes the second constant current circuit charge the capacitor only for a second predetermined time and a comparator to which a voltage produced at the external terminal is input.

6. The semiconductor device according to claim 5, wherein when the diagnosis portion diagnoses that an abnormality occurs, the control portion makes an error signal output portion output an error signal indicating the abnormality to an outside of the device.

7. The semiconductor device according to claim 6, wherein the error signal has a plurality of bits, and the control portion makes the error signal output portion output the error signal of a different piece of bit data according to a type of abnormality.

8. The semiconductor device according to claim 7, further comprising:

a switch portion which is included in the error signal output portion; and a plurality of external terminals which are respectively connected to a plurality of pull-up resistors that are provided outside the device, wherein the switch portion includes a plurality of transistors which are respectively connected to the external terminals, and the control portion controls turning on and off of the transistors.

9. The semiconductor device according to claim 1, wherein the component for setting is a resistor which divides an output voltage of a switching power supply circuit so as to feed back the output voltage.

10. The semiconductor device according to claim 1, wherein the component for setting is a resistor which divides an output voltage of a switching power supply circuit so as to detect an overvoltage of the output voltage.

11. The semiconductor device according to claim 2, further comprising:

an oscillator, wherein the component for setting is a resistor which sets an oscillation frequency of the oscillator.

12. The semiconductor device according to claim 3 further comprising:

an oscillator; and a frequency spread portion which changes an oscillation frequency of the oscillator, wherein the component for setting is a capacitor which sets the frequency spread portion.

13. The semiconductor device according to claim 3, further comprising:

a soft start portion which generates such a current limit value as to perform soft start of a switching power supply circuit, wherein the component for setting is a capacitor which sets a soft start time of the soft start portion.

14. The semiconductor device according to claim 3, wherein a switching power supply circuit which includes the semiconductor device drives an LED (light-emitting diode), the semiconductor device comprises a first feedback control mode in which an output voltage of the switching power supply circuit is controlled to be constant, a second feedback control mode in which a voltage on a cathode side of the LED is controlled to be constant and a constant current control circuit which turns on and off a current flowing through the LED according to a dimming signal in a shape of a pulse, the semiconductor device further comprises a switching portion which switches, according to a duty ratio of the dimming signal, between the first feedback control mode and the second feedback control mode and a duty ratio setting portion which sets such a threshold value of the duty ratio as to perform the switching with the switching portion and the component for setting is a capacitor for the setting by the duty ratio setting portion.

15. A light-emitting device comprising:

a power supply circuit which includes the semiconductor device according to claim 1; and a light-emitting element which is driven by the power supply circuit.

16. A light-emitting device comprising:

a power supply circuit which includes the semiconductor device according to claim 2; and a light-emitting element which is driven by the power supply circuit.

17. A light-emitting device comprising:

a power supply circuit which includes the semiconductor device according to claim 3; and a light-emitting element which is driven by the power supply circuit.

18. A display device comprising:

the light-emitting device according to claim 15.

19. The display device according to claim 18, wherein the display device is used as a vehicle-mounted display device.

* * * * *